WIDE-BAND LINEAR POWER AMPLIFIER
Filed Aug. 16, 1965
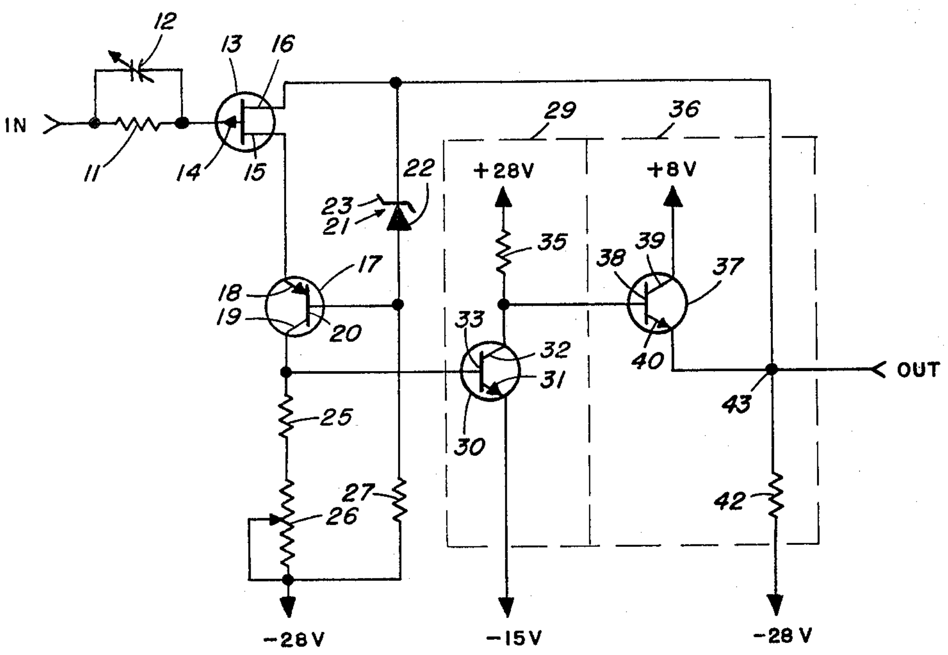
INVENTORS
WALTER E. MILBERGER
ALGIRDAS SIAURUSAITIS
SEYMOUR J. ROGAL
BY Claude Funkhouser
ATTORNEY
Leonard L. Lourie
AGENT United States Patent Office 3,383,615
Patented May 14, 1968

3,383,615

WIDE-BAND LINEAR POWER AMPLIFIER

Walter E. Milberger, Severna Park, Algirdas Siaurusaitis, Baltimore, and Seymour J. Rogal, Hyattsville, Md., assignors, by mesne assignments, to the United States of America as represented by the Secretary of the Navy Filed Aug. 16, 1965, Ser. No. 480,212
6 Claims. (Cl. 330—24)

ABSTRACT OF THE DISCLOSURE

The invention is directed to a wide-band linear amplifier. An emitter follower circuit having a field effect transistor (FET) in its feedback path is utilized. A transistor and a Zener diode are connected between the source and the drain of the FET. The circuit operates in response to input signals at the gate of the FET.

The present invention relates to a power amplifier and more in particular to a wide-band high input impedance linear amplifier for use in a radar receiver.

An object of the present invention is to provide a power amplifier with a high input impedance and a low output impedance.

Another object of the present invention is to provide an improvement in the frequency response and linearity thereof for a given open-loop gain.

A further object of the present invention is to provide a wide-band linear power amplifier with an increase in power without any change in amplitude and characteristics of the output signal from the input error signal.

Other objects, advantages and novel features of the present invention will become apparent from the following detailed description of the invention when considered in conjunction with the accompanying drawings wherein:

The single figure is an electrical circuit schematic diagram of the present invention.

Referring now to the drawings, an input signal is applied to an input impedance comprising a resistor 11 and variable capacitor 12 which are coupled to a field effect transistor 13, having a gate 14, drain 15, and source 16. A PNP transistor 17 having emitter 18, collector 19 and base 20 connects directly from its emitter 18 to the drain 15 of the field effect transistor 13. A Zener diode 21 having anode 22 and cathode 23 couples the base 20 of transistor 17 to the source 16 of the transistor 13.

Resistor 25 and variable resistor 26 connect the collector 19 of transistor 17 to a negative 28 volt biasing supply. Resistor 27 connects the anode 22 of Zener diode 21 to the negative 28 volt biasing supply for proper operation of the diode under a reverse voltage.

A cascade amplifier comprising an amplifier 29 and emitter follower 36 pair is connected to the output of transistor 17 at collector 19. The amplifier 29 comprises a NPN type transistor 30 having emitter 31, collector 32 and base 33 with the emitter connected to a negative 15 volt biasing supply and the collector connected to a positive 28 volt biasing supply through resistor 35. The input base 33 of the amplifier 29 is coupled to the collector 19 of transistor 17. The selection of the elements of amplifier 29 is made so that the transistor 30 operates linearly.

The emitter follower 36 comprises a transistor 37 having base 38, collector 39, an emitter 40 and is arranged in the common collector configuration. The collector 39 connects to a positive 8 volt biasing supply and the emitter to a negative 28 volt biasing supply through resistor 42. A feedback connection is made from the emitter 40 to the source 16 of the field effect transistor 13 so that the amplified error signal is compared with the input signal on the gate 14 of the transistor 13. The output of the circuit is taken from the emitter 40 of transistor 37 at output terminal 43.

In the operation of a power amplifier of the present invention an alternating input signal is applied to the gate 14 of the field effect transistor 13 through input impedance 11 and 12. The purpose of resistor 11 and capacitor 12 is to adjust the input admittance so that in the presence of capacitive feedback from source to gate oscillation of the amplifier is prevented and stable wide bandwidth is insured. Since the output of the emitter follower 36 from the transistor 37 is fed back to the source 16 of the field effect transistor 13, then the difference between the input and output signals is the same as the difference between the voltage on the gate 14 and source 16 of the field effect transistor 13. This voltage or signal difference between the gate and source of transistor 14 is called an error signal and it is this error signal which is amplified.

The value of resistor 27 is selected to establish the proper current through the Zener diode 21 for the breakdown voltage so that the diode acts as a low impedance path and maintains a constant voltage of 10 volts from the source 16 of transistor 13 and to the base 20 of transistor 17. By establishing 10 volts across the field effect transistor 13 from source to drain, transistor 13 operates above the pinch-off region where the drain current saturation occurs for a particular gate biasing. Assuming that the gate 14 and the source 16 of transistor 13 are at zero potential, then the voltage across the field effect transistor 13 from source 16 to drain 15 is 9.3 volts negative to ground, the voltage from emitter 18 to base 20 of transistor 17 is 0.7 volt negative and the DC voltage at the base 20 is minus 10 volts. Since the drain 15 sees a very low impedance because it looks into an emitter follower, the drain 15 to source 16 voltage will be constant and the transistor 17 takes the Zener voltage across the source to the drain.

When there is zero bias on the gate 14 of transistor 13 between the gate and the source, then the gate and source can be considered as being tied together electrically. From the operating characteristics of a field effect transistor, if the biasing voltage from the drain to the source is above the pinch-off voltage, then the drain current is relatively constant with any variation in drain-to-source voltage.

The drain current flowing through transistor 13 is the same as the emitter current for the emitter 18 of transistor 17. Since $\alpha$ of a transistor is defined as the ratio of change of collector current to emitter current with the voltage on the collector being constant, the value of $\alpha$ is very close to one (1) being within one percent thereof. Since the emitter current multiplied by the $\alpha$ of the transistor 17 is equal to the collector current, then the collector current is almost equivalent to the drain current of transistor 13. Consequently, the current flowing through resistors 25 and 26 is approximately the same as the drain current.

To make the proper adjustment for the operation of transistor 13, the gate 14 is grounded and the output from transistor 37 or the voltage on the source 16 is measured and adjusted to equal zero by varying resistor 26.

Any voltage variation on the gate 14 of a transistor 13 caused by the application of an input signal will tend to make a direct change in the drain current through the transistor 13. Unless the voltage on the source 16 follows the input signal on the gate 14 there will be an error signal or a voltage difference between the bate and source which is amplified. Any variation in voltages across resistors 25 and 26 caused by changes in the drain current will be isolated from the transistor 13 by the transistor 17. These voltages do not affect the operating condition of transistor 13, and consequently transistors 13 and 17 can be considered together as an equivalent field effect transistor. The transconductance of the combination would be the transconductance $g_m$ of transistor 13 which is 2500 micromhos. The output impedance of transistor 17 is the deciprocal of the output admittance thereof and would be equivalent to the dynamic plate resistance $r_p$ which approaches one megohm. Since the amplification factor or $\mu$ is defined as being equal to $g_m$ multiplied by $r_p$ then the amplification factor for transistors 13 and 17 in combination is equal to 2500. The amplification factor for this field effect transistor 13 alone is equal to 40.

The voltage difference between the gate and source of transistor 13 or the error signal causes a change in drain current through the transistor. From the characteristics of transistor 13, the error signal multiplied by the trans-conductance, $g_m$, of the transistor equals the change in drain current. The change in drain current which flows through resistors 25 and 26 causes a change in voltage at the collector 19 of transistor 17. This amplified error signal at the collector 19 is applied to the cascade pair 29 and 36 in which an additional gain occurs reducing the difference between the gate and source by feeding back to the source a change in voltage which follows the change in the input signal.

In analyzing the circuit, the amplification factor $\mu$ for circuit would be defined as follows:

$$\mu=\frac{\partial V_{out}}{\partial V_{gs}}$$

where $\partial V_{Out}$ is the change in the amplified error signal on the emitter of transistor 37 and $\partial V_{gs}$ is the change in voltage between the gate and the source of transistor 13. Since the output of emitter of transistor 37 is fed back to the source of transistor 17, the change of voltage output, $\partial V_{Out}$, is approximately equal to the change in $\partial V_{In}$. As a consequence, $$\partial V_{gs}\cong\frac{1}{\mu}\partial V_{in}$$

The limit on the error voltage can be no smaller than the reciprocal of the amplification factor times the change in input voltage for infinite loop gain. Since the loop gain is not infinite, the error voltage is slightly larger but approaches the theoretical limitation very closely.

Although the dynamic resistance is high looking into emitter 40 of transistor 37, the output impedance is low since the transistor absorbs the change in current and does not allow the emitter to change appreciably in potential, the output impedance being 0.024 ohm to ground. It is to be noted that the bulk of the current flows through the biasing resistor 42 for transistor 37.

By boostrapping the field effect transistor 13 with the Zener diode 21 and transistor 17, the voltage drop from source to drain is constant throughout the dynamic range of the input signals. As a result there is no voltage variation between the gate and drain which reduces the drain to gate capacitance. Since the gate and source are maintained at the same biasing potential and held constant and since the positive feedback from the drain to the source through the circuit keeps the gate to source voltage difference at a minimum, the effect of the input capacitance between the gate and source is minimized. By reduction of these capacitances of transistor 13, the frequency response is improved for input signals at high frequencies. Since the amplification factor of transistor 13 alone has been increased by the circuit arrangement, the linearity and passband characteristics have been greatly improved over a standard compound emitter-follower amplifier characteristics.

The power amplifier of the present invention was tested and yielded these typical characteristics:

| | |
|---|---|
| Bandwidth | DC to 27 megacycles. |
| Power gain | 234 db at DC 30 db at 10 megacycles. |
| Linearity | Non-linearity less than 0.1% of the input amplitude. |
| Input impedance | 100 megohms at DC 95 kilohms at 10 megacycles. |
| Output impedance | Less than 0.025 ohm. |
| Effective Input Capacitance | 0.16 picofarad. |

Input and output DC offset adjustable through zero volts.

Obviously many modifications and variations of the present invention are possible in the light of the above teachings. It is therefore to be understood that within the scope of the appended claims the invention may be practiced otherwise than as specifically described.

What is claimed is:

1. A power amplifier comprising:
first means comprising an input impedance means, a field effect transistor having a source, drain and gate with said gate being connected to said input impedance means;
second means comprising a Zener diode having an anode and cathode, a p-n-p transistor having a base, emitter and collector, adjustable resistance means, and negative biasing means, said emitter of said second means transistor being directly connected to said drain of said field effect transistor, said base of said second means transistor being connected to said anode of said Zener diode, said cathode of said Zener diode being connected to said source of said field effect transistor, said negative biasing means being connected to said collector of said second means transistor through said adjustable resistance means whereby the amount of drain current can be varied by changing the value of the adjustable resistance means and the voltages from said source to said drain are maintained constant throughout changes in the voltage from gate to source by variation of input signals applied to said input impedance means;
third means comprising a transistor having a base, emitter and collector, said base of said third means transistor being connected to said collector of said second means transistor;
a source of bias connected to the collector of said third means transistor;
fourth means comprising a transistor having a base, emitter and collector connected as an emitter follower, said base of said fourth means transistor being connected to said collector of said third means transistor, said emitter of said fourth means transistor being connected to said source whereby unity positive feedback from source to drain is established;
a source of bias connected to the collector of said fourth means transistor; and
an output terminal connected to the emitter of said fourth means transistor.

2. A power amplifier comprising:
first means comprising an input impedance means, a field effect transistor having a source, drain and gate with said gate being connected to said input impedance means with
second means comprising adjustable resistance means, a Zener diode having an anode and cathode, a p-n-p transistor having a base, emitter and collector, said adjustable resistance means connected to said collector, said emitter of said second means transistor being directly connected to said drain of said field effect transistor, said base of said second means transistor being connected to said anode of said Zener diode, said cathode of said Zener diode being connected to said source of said field effect transistor, and second resistance means for said Zener diode for establishing the proper current to said Zener diode under reverse biasing conditions so that said Zener diode maintains a constant voltage drop across said source to said drain of said field effect transistor through said second means transistor, said adjustable resistance means determining the drain current through said field effect transistor, said second means transistor isolating any of the voltage changes on said collector of said second means transistor caused by changes in drain current due to changes in the signal applied to said gate of said field effect transistor whereby said field effect transistor operates at the same point through the dynamic range of applied input signals;

third means comprising a third transistor having a base, emitter and collector, said base of said third means transistor being connected to said collector of said second means transistor;

a source of bias connected to the emitter of said third transmitter;

fourth means comprising a fourth transistor having a base, emitter and collector connected as an emitter follower, said base of said fourth means transistor being connected to said collector of said third transistor, said emitter of said fourth transistor being connected to said source of said field effect transistor whereby unity positive feedback from said drain to said source is established;

a source of bias connected to the collector of said fourth transistor;

an output terminal connection being connected to said emitter of said fourth transistor whereby an increase in power is accomplished by an increase in current without any change in the amplitude and characteristics of output signal at said output terminal connection from the input signal.

3. In a power amplifier, a first transistor having a base, an emitter and a collector;

a field effect transistor having a source, a drain and a gate, said source being connected to the emitter of said first transistor and said drain being connected to the base of said first transistor;

a source of bias voltage connected to the collector of said first transistor;

voltage regulator means connected to said source and said drain for maintaining a constant voltage drop across said source and said drain;

said amplifier operating in response to input signals applied at the gate of said field effect transistor and yielding output signals at the emitter of said first transistor.

4. In a power amplifier, as in claim 3, wherein said voltage regulator includes a Zener diode.

5. In a power amplifier as in claim 4 further including:

a transistor having three terminals, two terminals of said transistor being connected between the drain of said field effect transistor and the base of said first transistor and said Zener diode being connected to the source of said field effect transistor and the third terminal of said second transistor.

6. In a power amplifier as in claim 5 further including a source of variable bias voltage connected at the junction of said second transistor and the base of said first transistor.

References Cited

UNITED STATES PATENTS 3,257,631 6/1966 Evans ............ 330—28 X

JOHN KOMINSKI, *Acting Primary Examiner.*

ROY LAKE, *Examiner.*

L. J. DAHL, *Assistant Examiner.*